United States Patent
Hu et al.

(10) Patent No.: US 8,461,640 B2
(45) Date of Patent: Jun. 11, 2013

(54) FIN-FET NON-VOLATILE MEMORY CELL, AND AN ARRAY AND METHOD OF MANUFACTURING

(75) Inventors: Yaw Wen Hu, Cupertino, CA (US); Prateep Tuntasood, San Jose, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 357 days.

(21) Appl. No.: 12/555,756

(22) Filed: Sep. 8, 2009

(65) Prior Publication Data

US 2011/0057247 A1 Mar. 10, 2011

(51) Int. Cl.
*H01L 29/788* (2006.01)
(52) U.S. Cl.
USPC ............ 257/320; 257/316; 257/319; 257/321
(58) Field of Classification Search
USPC .................................. 257/316, 319, 320, 321
See application file for complete search history.

(56) References Cited

U.S. PATENT DOCUMENTS

| | | | |
|---|---|---|---|
| 6,747,310 B2 * | 6/2004 | Fan et al. ...................... | 257/320 |
| 6,768,158 B2 | 7/2004 | Lee et al. | |
| 6,831,310 B1 | 12/2004 | Mathew et al. | |
| 6,885,044 B2 * | 4/2005 | Ding ............................ | 257/202 |
| 6,933,558 B2 | 8/2005 | Hill et al. | |
| 6,958,512 B1 | 10/2005 | Wu et al. | |
| 6,963,104 B2 | 11/2005 | Wu et al. | |
| 7,129,536 B2 | 10/2006 | Chen et al. | |
| 7,154,779 B2 | 12/2006 | Mokhlesi et al. | |
| 7,196,372 B1 | 3/2007 | Yu et al. | |
| 7,230,848 B2 * | 6/2007 | Forbes ...................... | 365/185.03 |
| 7,279,735 B1 | 10/2007 | Yu et al. | |
| 7,285,820 B2 * | 10/2007 | Park et al. ..................... | 257/316 |
| 7,309,634 B2 | 12/2007 | Hong | |
| 7,348,246 B2 | 3/2008 | Kim et al. | |
| 7,352,018 B2 | 4/2008 | Specht et al. | |
| 7,375,394 B2 | 5/2008 | Jeng | |
| 7,402,862 B2 | 7/2008 | Choi et al. | |
| 7,410,913 B2 | 8/2008 | Lee et al. | |
| 7,423,310 B2 | 9/2008 | Verhoeven | |
| 7,851,843 B2 * | 12/2010 | Lee et al. ...................... | 257/309 |

(Continued)

OTHER PUBLICATIONS

PCT Search Report and Written Opinion dated Oct. 15, 2010 corresponding to the related PCT Patent Application No. US10/47276.

*Primary Examiner* — Matthew W Such
*Assistant Examiner* — David Spalla
(74) *Attorney, Agent, or Firm* — DLA Piper LLP (US)

(57) ABSTRACT

A non-volatile memory cell has a substrate layer with a fin shaped semiconductor member of a first conductivity type on the substrate layer. The fin shaped member has a first region of a second conductivity type and a second region of the second conductivity type, spaced apart from the first region with a channel region extending between the first region and the second region. The fin shaped member has a top surface and two side surfaces between the first region and the second region. A word line is adjacent to the first region and is capacitively coupled to the top surface and the two side surfaces of a first portion of the channel region. A floating gate is adjacent to the word line and is insulated from the top surface and is capacitively coupled to the two side surfaces of a second portion of the channel region. A coupling gate is capacitively coupled to the floating gate. An erase gate is insulated from the second region and is adjacent to the floating gate and coupling gate.

12 Claims, 11 Drawing Sheets

U.S. PATENT DOCUMENTS

| | | |
|---|---|---|
| 7,851,846 B2 * | 12/2010 | Do et al. .................. 257/320 |
| 2006/0097310 A1 | 5/2006 | Kim |
| 2006/0141706 A1 | 6/2006 | Hong |
| 2006/0197140 A1 | 9/2006 | Muralidhar |
| 2006/0237777 A1 | 10/2006 | Choi |
| 2007/0018201 A1 | 1/2007 | Specht |
| 2007/0018245 A1 | 1/2007 | Jeng |
| 2007/0063261 A1 * | 3/2007 | Chen et al. ............... 257/316 |
| 2007/0132009 A1 * | 6/2007 | Takeuchi et al. .......... 257/321 |
| 2007/0164352 A1 | 7/2007 | Padilla |
| 2007/0215954 A1 | 9/2007 | Mouli |
| 2007/0246775 A1 | 10/2007 | Park |
| 2008/0079060 A1 | 4/2008 | Zhu |
| 2008/0121970 A1 | 5/2008 | Aritome |
| 2008/0128792 A1 | 6/2008 | Kim et al. |
| 2008/0203462 A1 | 8/2008 | Goarin |
| 2008/0230824 A1 | 9/2008 | Doornbos et al. |
| 2009/0108328 A1 * | 4/2009 | Widjaja et al. ............ 257/320 |

* cited by examiner

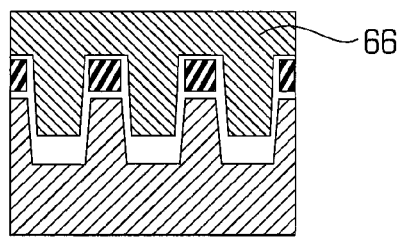
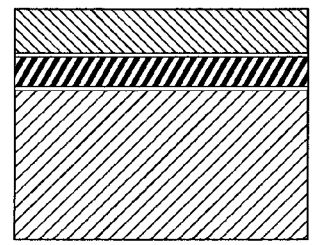
FIG. 4A-5    FIG. 4C-5
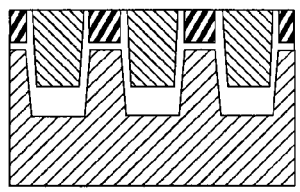
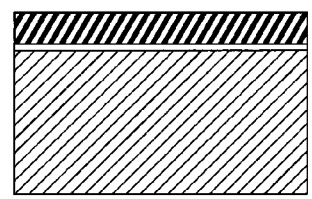
FIG. 4A-6    FIG. 4C-6
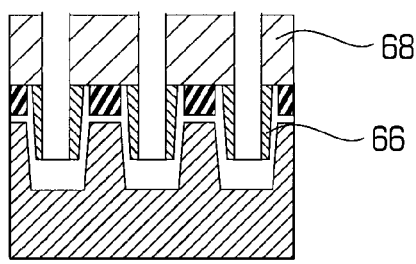
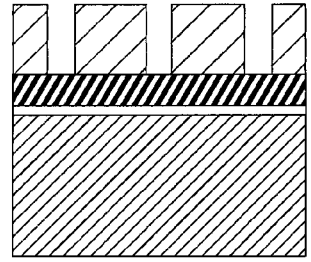
FIG. 4A-7    FIG. 4C-7
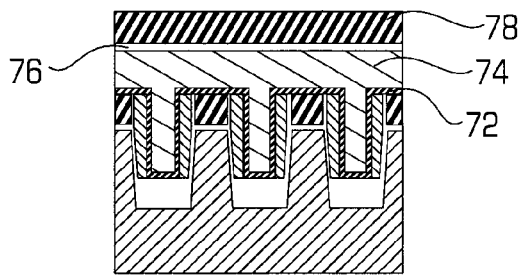
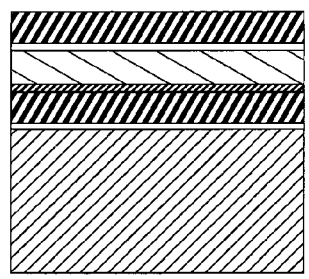
FIG. 4A-8    FIG. 4C-8

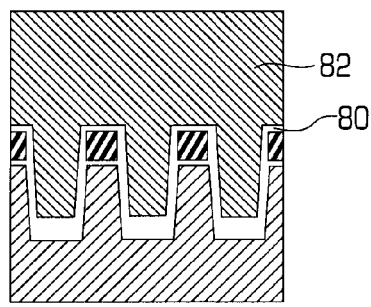
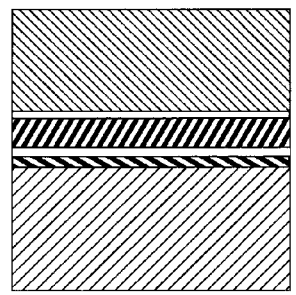
FIG. 4A-13                FIG. 4C-13
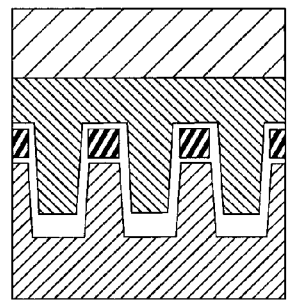
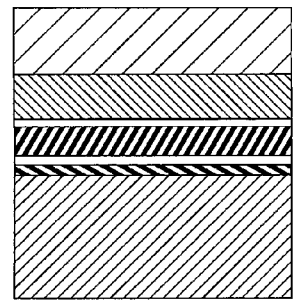
FIG. 4A-14                FIG. 4C-14
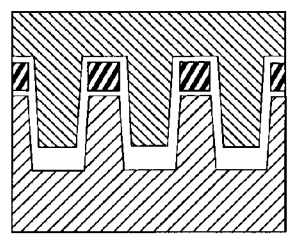
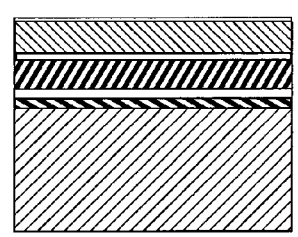
FIG. 4A-15                FIG. 4C-15
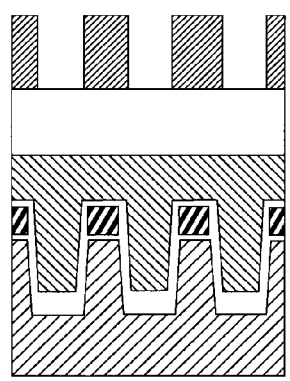
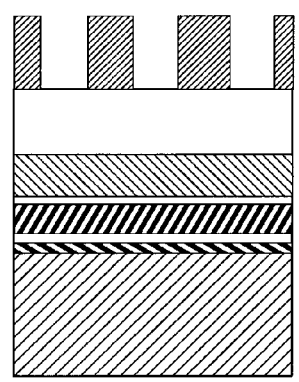
FIG. 4A-16                FIG. 4C-16

FIN-FET NON-VOLATILE MEMORY CELL, AND AN ARRAY AND METHOD OF MANUFACTURING

TECHNICAL FIELD

The present invention relates to a Fin-Fet non-volatile memory cell structure, and array. The present invention also relates to a method of manufacturing the memory array.

BACKGROUND OF THE INVENTION

Non-Volatile memory cells using floating gates to control the conduction of current in a planar channel region is well known in the art. See for example U.S. Pat. No. 6,747,310, as the scale of integration increases, i.e. the geometry of the lithography for semiconductor processing decreases in size, the problem with a planar channel region is that the channel region becomes narrower. This reduces the current flow between the source and drain regions, requiring more sensitive sense amplifiers etc. to detect the state of the memory cell.

Because the problem of shrinking the lithography size thereby reducing the channel width affects all semiconductor devices, a Fin-FET type of structure has been proposed. In a Fin-FET type of structure, a fin shaped member of semiconductor material connects the source to the drain regions. The fin shaped member has a top surface and two side surfaces. Current from the source to the drain regions can then flow along the top surface as well as the two side surfaces. Thus, the width of the channel region is increased, thereby increasing the current flow. However, the width of the channel region is increased without sacrificing more semiconductor real estate by "folding" the channel region into two side surfaces, thereby reducing the "footprint" of the channel region. Non-volatile memory cells using such Fin-FETs have been disclosed. Some examples of prior art Fin-FET non-volatile memory structures include U.S. Pat. Nos. 7,423,310 and 7,410,913. However, heretofore, these prior art Fin-FET structures have disclosed using floating gate as a stack gate device, or using trapping material, or using SRO (silicon rich oxide) or using nanocrystal silicon to store charges.

SUMMARY OF THE INVENTION

Accordingly, in the present invention a non-volatile memory cell has a substrate layer with a fin shaped semiconductor member of a first conductivity type on the substrate layer. The fin shaped member has a first region of a second conductivity type and a second region of the second conductivity type, spaced apart from the first region with a channel region extending between the first region and the second region. The fin shaped member has a top surface and two side surfaces between the first region and the second region. A word line is adjacent to the first region and is capacitively coupled to the two side surfaces of a first portion of the channel region. A floating gate is adjacent to the word line and is capacitively coupled to a second portion of the channel region. A coupling gate is capacitively coupled to the floating gate. An erase gate is insulated from the second region and is adjacent to the floating gate and the coupling gate.

The present invention also relates to a memory device with the foregoing memory cell, and an array of memory cells of the foregoing type.

DETAILED DESCRIPTION OF THE PREFERRED EMBODIMENT

Figure 1:
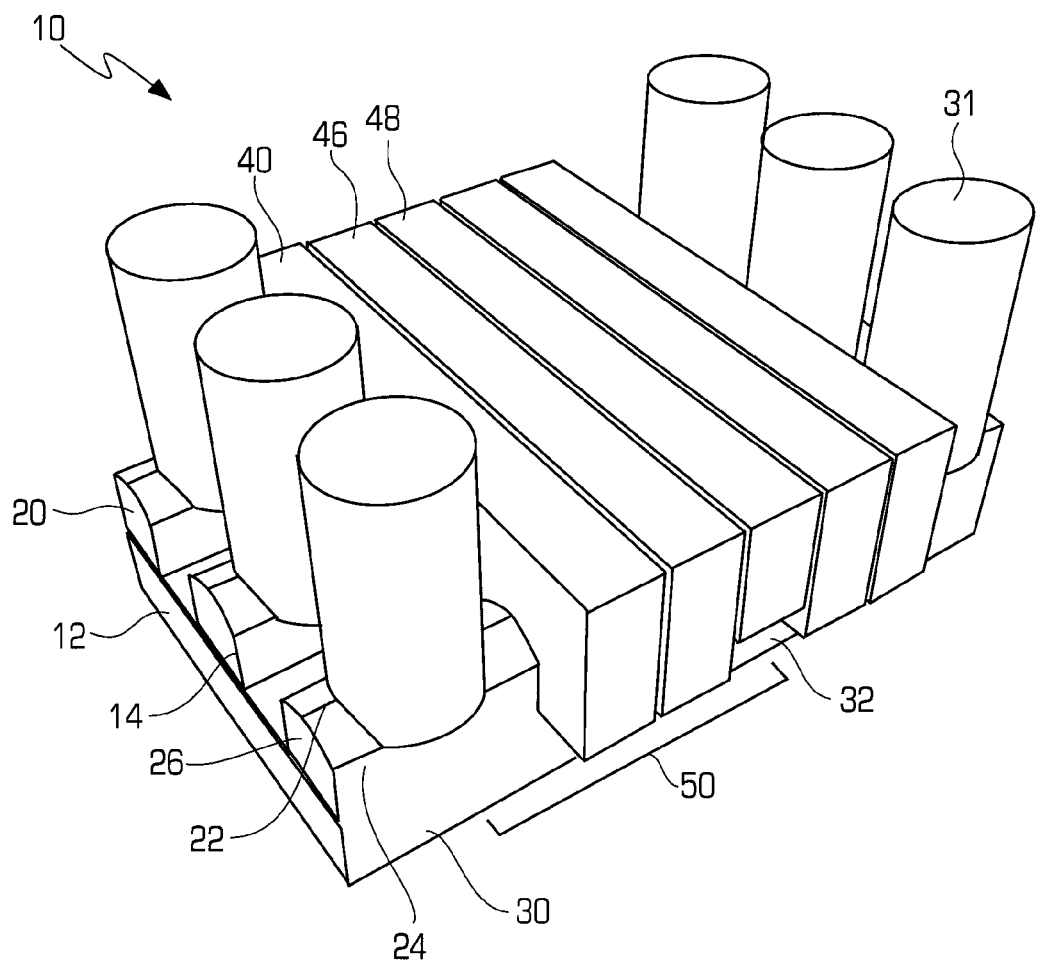
FIG. 1 is a perspective view of a memory array of the present invention.

Referring to FIG. 1 there is shown a perspective view of an array 10 of Fin-FET non-volatile memory cells 50 of the present invention. Functionally, the memory cells 50 are of the type disclosed in U.S. Pat. No. 6,747,310 whose disclosure is hereby incorporated in its entirety. The array 50 comprises a substrate 12. The substrate 12 can be an insulator or it can be a semiconductor substrate 12. A plurality of fin shaped members 20 are positioned spaced apart from one another on the substrate 12. Each of the fin shaped members 20 is made of a single crystalline material, such as silicon. Thus, in the event the substrate 12 is also of semiconductor material then the fin shaped members will be lattice matched to the crystalline structure of the substrate 12. Further, an insulator 14 may separate each of the fin shaped members 20 from the substrate 12. The insulator 14 may be of silicon dioxide. Thus, the fin shaped members 20 are on a silicon dioxide layer 14 on a substrate 12, and is of an SOS type of structure, which is well known in the art. However, that is not necessary and as will be seen, a preferred example of a method for making the array 10 without the insulator 14 will be discussed hereinafter.

Each of the fin shaped members 20 is substantially longitudinally shaped and extends from one end to another end, in a first direction (called column direction) with all of the fin shaped members 20 being parallel to one another and spaced apart from one another in a second direction (row direction) which is perpendicular to the first direction. Each of the fin shaped members 20 has a top surface 22 and two side surfaces (24 and 26), and is lightly doped with a first conductivity (such as P type). Further, each of the fin shaped members 20 has a first region 30 of a second conductivity type (such as N type) at one end, with a second region 32 of the second conductivity type at another end, with a channel region therebetween. A bit line 31 makes electrical contact to the first regions 30 and connects all of the first regions 30 of the same fin shaped member 20 in the same column direction. The second region 32 electrically connects in the row direction all of the second regions 32 of the different fin shaped members 20 in different rows.

Immediately adjacent to the first region 30 and between the first region 30 and the second region 32 is a word line 40. The word line 40 is electrically insulated from the fin shaped member 20 by a layer of buffered polysilicon 60 of about 200 Angstroms with a layer of pad nitride 62 of about 450 angstroms on the layer of buffered polysilicon 60. The word line 40 is capacitively coupled to the channel region of a fin shaped member 20 by the "side surfaces" by the word line oxide layer 80. A word line 40 extends in a row direction and connects all of the word lines of the fin shaped members 20 in different rows.

Immediately adjacent to the word line 40 of each fin shaped member 20 is a floating gate 44. The floating gate 44 has two sections: 44a and 44b, separate from one another, with each section positioned adjacent to a side surface (24 and 26) of each fin shaped member 20. Each floating gate 44 is capacitively coupled to the side surface 24 and 26 of the fin shaped member 20.

A coupling gate 46 is capacitively coupled to the floating gate 44 and is "above" the floating gate 44. The coupling gate 46 also extends in the row direction and connects to all the coupling gates 46 of the fin shaped members 20 in the same row.

Finally an erase gate 48 is "above" the second region 32, and is insulated from the second region 32. The erase gate 48 also extends in the row direction and connects to all the erase gates 48 of the fin shaped members 20 in the same row. As discussed hereinabove, the operation of the memory cell 50 is fully disclosed in U.S. Pat. No. 6,747,310 whose disclosure is hereby incorporated in its entirety.

Figure 2:
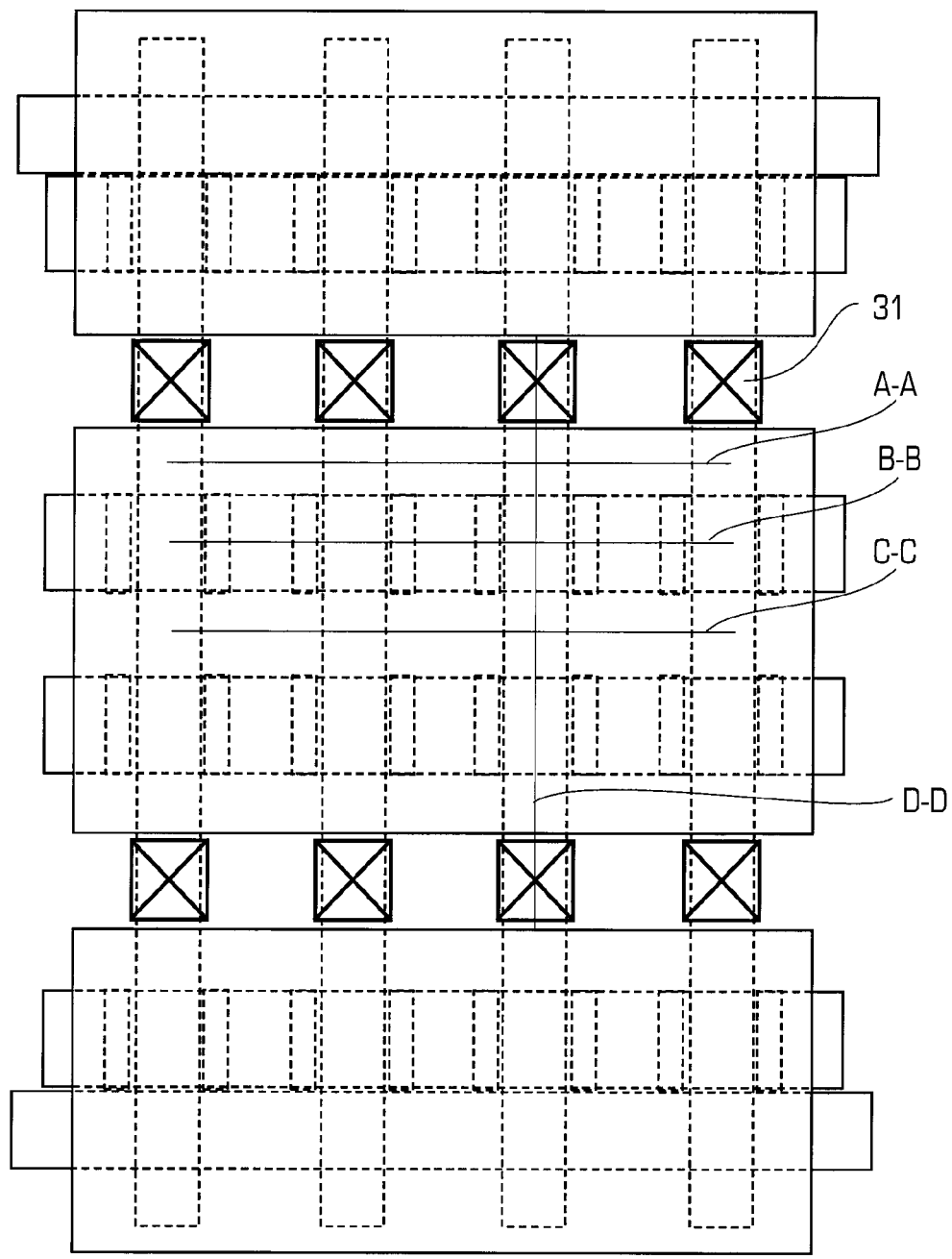
FIG. 2 is a top planar view of the memory array shown in FIG. 1.
Figure 3A:
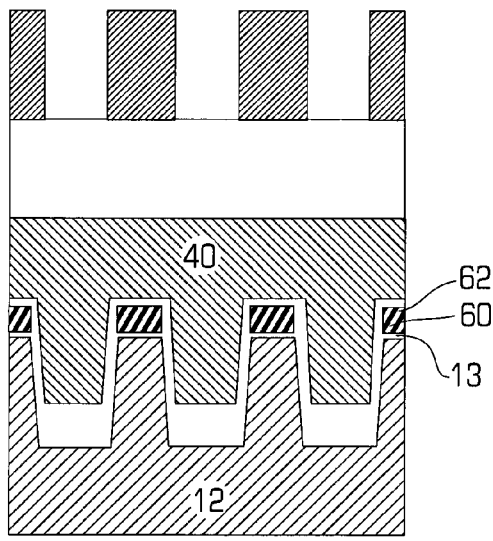
FIG. 3(A-D) are cross sectional views of the memory array shown in FIG. 2 taken along the lines A-A, B-B, C-C, and D-D respectively.
Figure 3B:
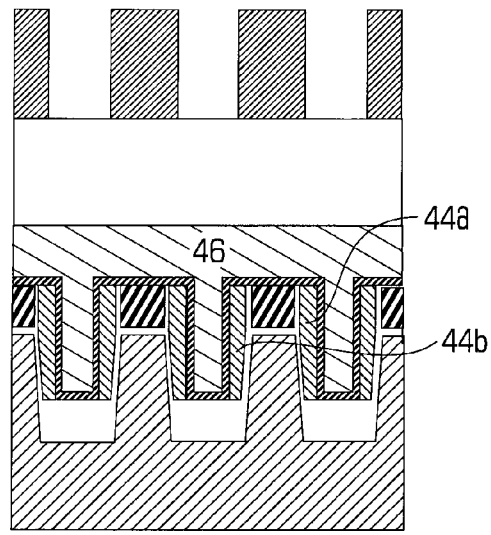
Figure 3C:
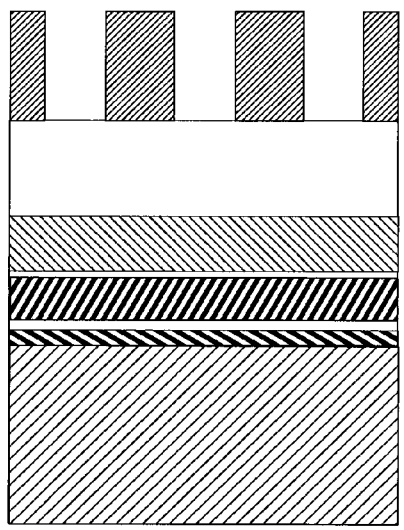
Figure 3D:
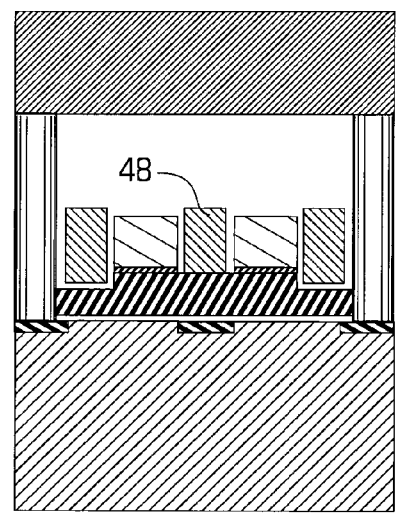

Referring to FIG. 2 there is shown a top planar view of the memory array 50 shown in FIG. 1. A cross-sectional view of the memory array 50 taken along the line A-A is shown in FIG. 3A. A cross-sectional view of the memory array 50 taken along the line B-B is shown in FIG. 3B. A cross-sectional view of the memory array 50 taken along the line C-C is shown in FIG. 3C. A cross-sectional view of the memory array 50 taken along the line D-D is shown in FIG. 3D.

Figures 1, 4A:
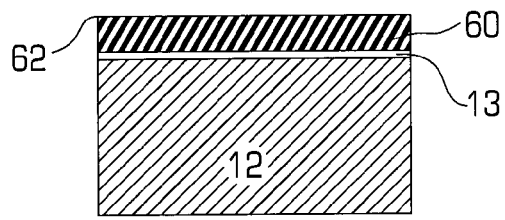
FIG. 4A(1-16), 4B(1-16), 4C(1-16) and 4D(1-16) are cross sectional views of the memory array shown in FIG. 2 taken along the lines A-A, B-B, C-C, and D-D respectively, showing the processing steps (1-16) to make the memory array shown in FIG. 1.

Referring to FIGS. 4A-1 there is shown a cross-section views of the memory array 50 taken along the line A-A in the first step of making the array 50 of the present invention. A pad oxide 13 of approximately 170 Angstroms is formed on the substrate 12. Buffered polysilicon 60 of about 200 Angstroms is then deposited on the pad oxide 13. Thereafter, a layer of pad nitride 62 of about 450 angstroms is deposited on the layer of buffered polysilicon 60.

Figures 1, 4C:
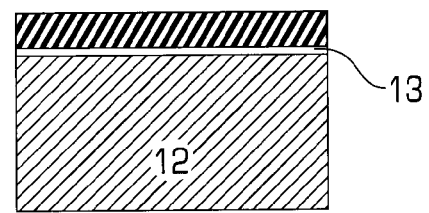
Figures 2, 4A:
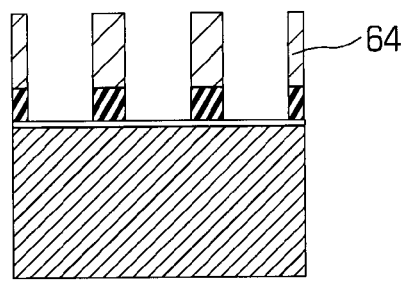
Figures 2, 4C:
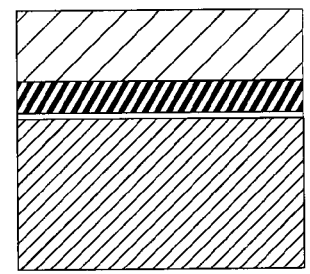
Figures 3, 4A:
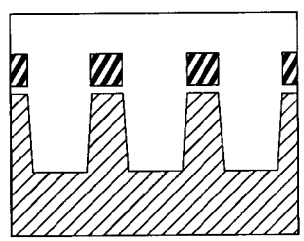
Figures 3, 4C:
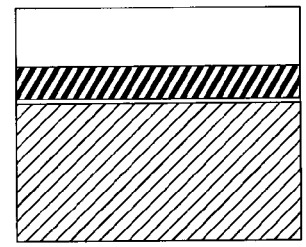
Figures 4, 4A:
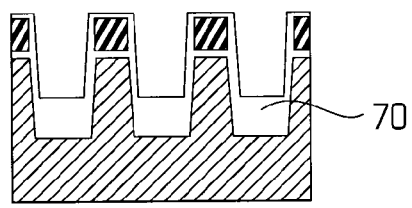
Figures 4, 4C:
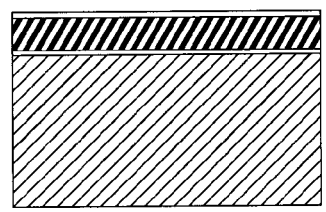
Figures 4, 4A, 5, 6, 7, 8, 9:
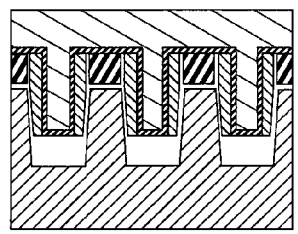
Figures 4, 4C, 5, 6, 7, 8, 9:
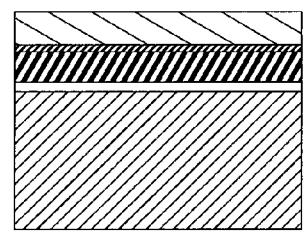
Figures 4, 4A, 5, 6, 7, 8, 9, 10:
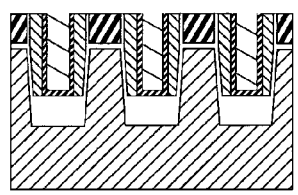
Figures 4, 4C, 5, 6, 7, 8, 9, 10:
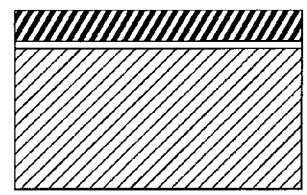
Figures 4, 4A, 5, 6, 7, 8, 9, 10, 11:
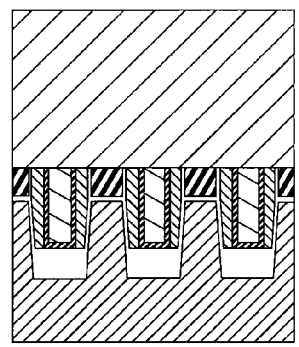
Figures 4, 4C, 5, 6, 7, 8, 9, 10, 11:
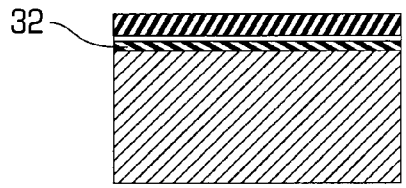
Figures 4, 4A, 5, 6, 7, 8, 9, 10, 11, 12:
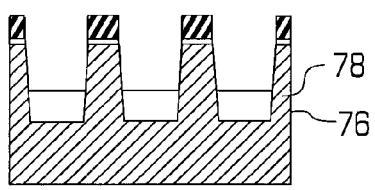
Figures 4, 4C, 5, 6, 7, 8, 9, 10, 11, 12:
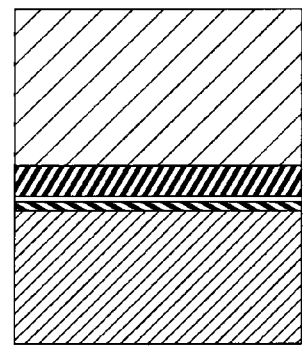
Figures 1, 4B:
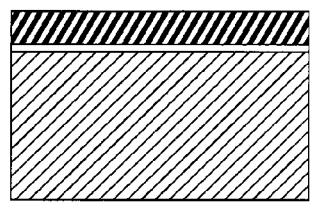
Figures 1, 4D:
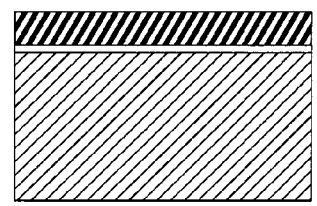
Figures 2, 4B:
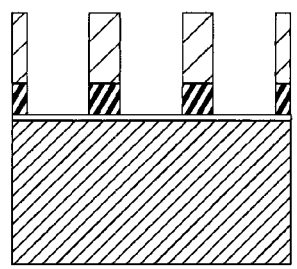
Figures 2, 4D:
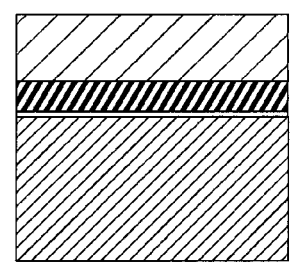
Figures 3, 4B:
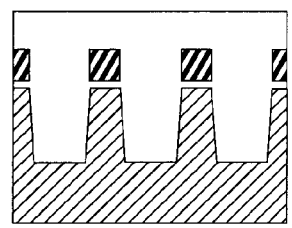
Figures 3, 4D:
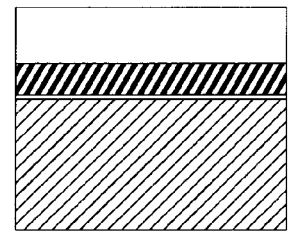
Figures 4, 4B:
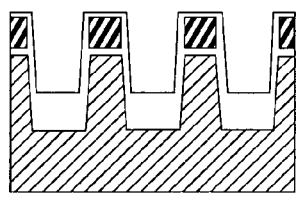
Figures 4, 4D:
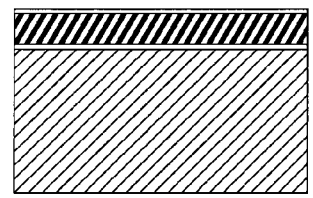
Figures 4, 4B, 5:
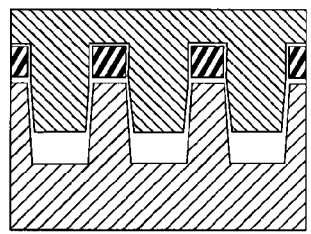
Figures 4, 4D, 5:
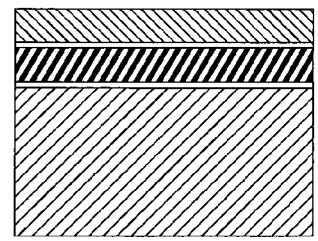
Figures 4, 4B, 5, 6:
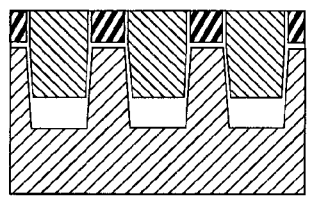
Figures 4, 4D, 5, 6:
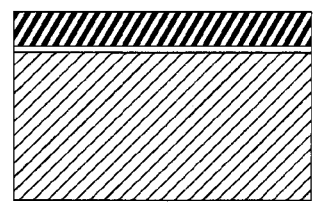
Figures 4, 4B, 5, 6, 7:
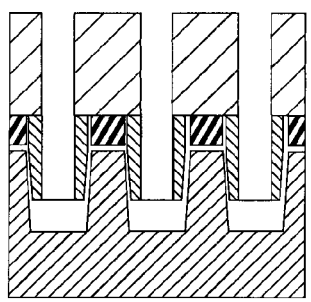
Figures 4, 4D, 5, 6, 7:
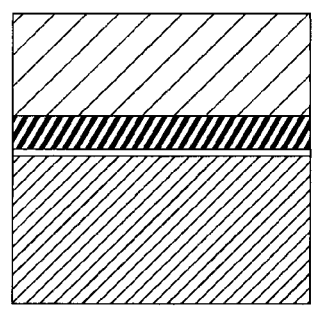
Figures 4, 4B, 5, 6, 7, 8:
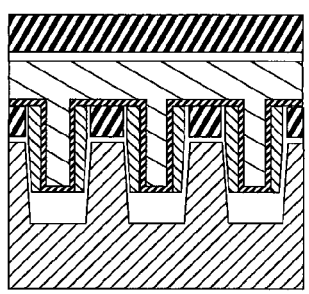
Figures 4, 4D, 5, 6, 7, 8:
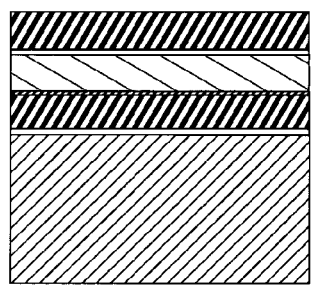
Figures 4, 4B, 5, 6, 7, 8, 9:
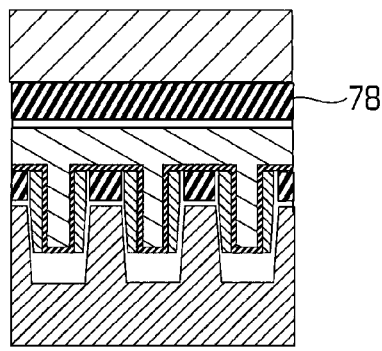
Figures 4, 4D, 5, 6, 7, 8, 9:
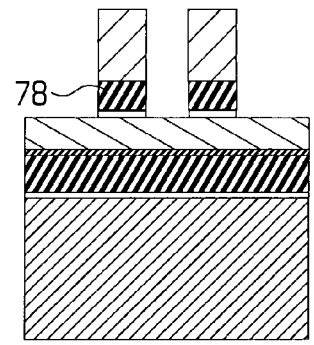
Figures 4, 4B, 5, 6, 7, 8, 9, 10:
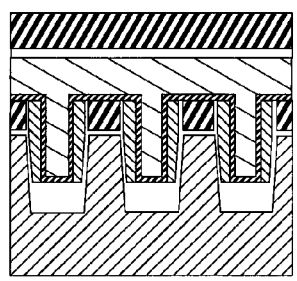
Figures 4, 4D, 5, 6, 7, 8, 9, 10:
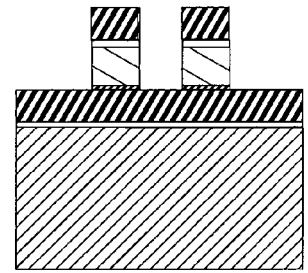
Figures 4, 4B, 5, 6, 7, 8, 9, 10, 11:
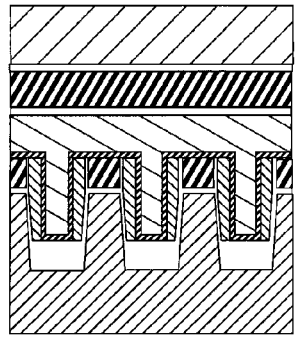
Figures 4, 4D, 5, 6, 7, 8, 9, 10, 11:
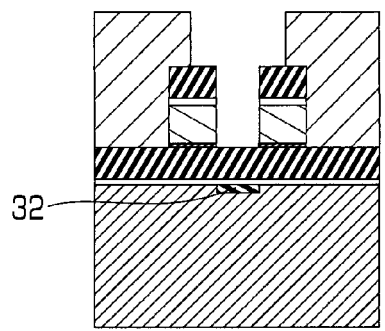
Figures 4, 4B, 5, 6, 7, 8, 9, 10, 11, 12:
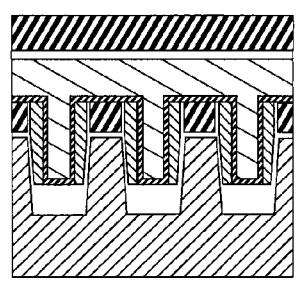
Figures 4, 4D, 5, 6, 7, 8, 9, 10, 11, 12:
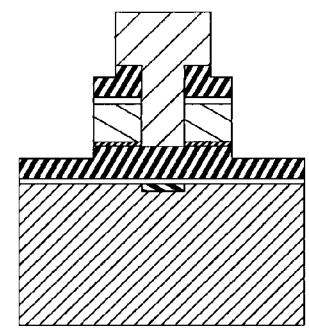
Figures 4, 4B, 5, 6, 7, 8, 9, 10, 11, 12, 13:
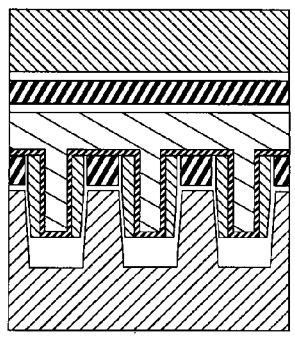
Figures 4, 4D, 5, 6, 7, 8, 9, 10, 11, 12, 13:
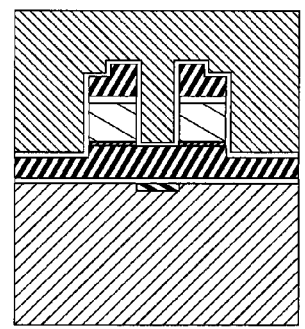
Figures 4, 4B, 5, 6, 7, 8, 9, 10, 11, 12, 13, 14:
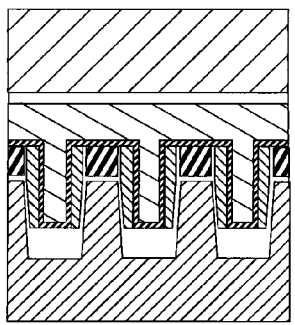
Figures 4, 4D, 5, 6, 7, 8, 9, 10, 11, 12, 13, 14:
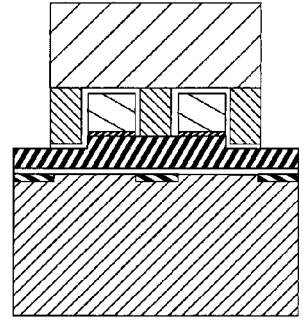
Figures 4, 4B, 5, 6, 7, 8, 9, 10, 11, 12, 13, 14, 15:
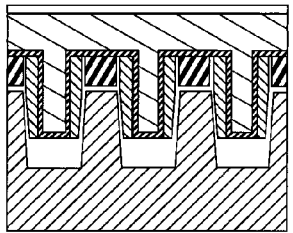
Figures 4, 4D, 5, 6, 7, 8, 9, 10, 11, 12, 13, 14, 15:
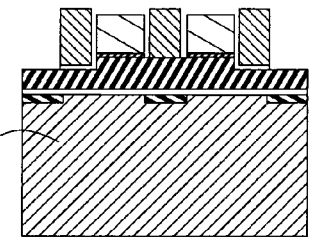
Figures 4, 4B, 5, 6, 7, 8, 9, 10, 11, 12, 13, 14, 15, 16:
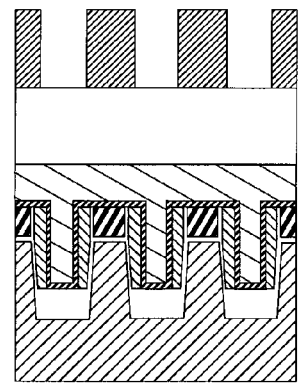
Figures 4, 4D, 5, 6, 7, 8, 9, 10, 11, 12, 13, 14, 15, 16:
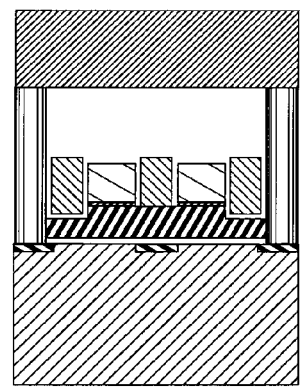

A masking step is formed with a mask 64. Openings are make in the mask 64 in the row direction of A-A and B-B (see FIGS. 4A-2 and 4B-2). Through openings in the mask, the pad nitride 62 and polysilicon 60 are etched until the pad oxide 13 is reached. However, the mask is not etched in the area above the second region 32, as shown in FIG. 4C-2, nor in the column direction over the active region as shown in FIG. 4D-2. The resultant structure is shown in FIGS. 4(A-D)-2.

The opening in the mask 64 is then used to further etch the pad oxide 13, and into the substrate 12. The mask 64 is then removed. The structure is then subject to an oxidation step causing silicon dioxide (of approximately 200 angstroms) to form along the side of the trench. Silicon dioxide 70 then fills the trench The resultant structure is shown in FIGS. 4(A-D)-3.

A partial silicon dioxide etch is performed to partially remove the silicon dioxide 70 from the trench, leaving approximately 500 Angstroms in the trench. Another silicon dioxide deposition step is performed to form a layer of silicon dioxide around the polysilicon 60 and the silicon nitride 62. The resultant structure is shown in FIGS. 4(A-D)-4.

Polysilicon 66 is deposited everywhere. The amount of polysilicon deposited is on the order of 800 Angstroms. The resulting structure is shown in FIGS. 4(A-D)-5.

The polysilicon 66 is subject to a planarization step until the pad nitride 62 is reached. The resultant structure is shown in FIGS. 4(A-D)-6.

A second masking step is then performed. The mask 68 is opened in the region above the trench in the column direction as shown in FIGS. 4A-7 and 4B-7. Through the trench, the exposed polysilicon 66 is then etched until the silicon dioxide 70 is reached. This results in polysilicon 66 being formed along the sides of the trench and functions as the floating gate. The resultant structure is shown in FIGS. 4(A-D)-7.

A layer 72 of ONO (Silicon dioxide/silicon nitride/silicon dioxide), a composite material is deposited everywhere. The ONO layer 72 is on the order of 150 Angstroms. Polysilicon 74 on the order of 1000 angstroms is deposited everywhere. The polysicilion 74 forms the coupling gate 46. A layer 76 of silicon dioxide, on the order of 200 Angstroms is deposited everywhere. A layer 78 of silicon nitride is then deposited on the silicon dioxide 76. The resultant structure is shown in FIGS. 4(A-D)-8.

Another masking step is performed. The mask however, is positioned over the coupling gates 46 (as shown in FIGS. 4B-9 and 4D-9), and openings are created everywhere else (as shown in FIGS. 4A-9 and 4C-9. After the openings are formed, the silicon dioxide layer 76 and the silicon nitride layer 78 are etched, with the polysilicon 74 forming an etch stop.

The mask is removed. The polysilicon 74 is etched. The composite layer 72 of ONO is then etched, until the polysilicon 66 is reached. The resultant structure is shown in FIGS. 4(A-D)-10.

Another masking step is formed. Openings are created along the line C-C which is "above" the erase gate 48, which is "above" the second region 32. Ion implantation is then performed everywhere, and through the "thinner" portion of the structure, which is not covered by the mask, the ion implantation forms the second region 32. The resultant structure is shown in FIGS. 4(A-D)-11.

A reverse masking step is performed, i.e. where openings were created in the structure shown in FIGS. 4(A-D)-11, they are now filled (essentially along the lines C-C, and where a mask existed, it is now removed. The floating gate 66 which is exposed in the trench and the polysilicon 74 are removed from the trench adjacent to the fin shaped members 20. The resultant structure is shown in FIGS. 4(A-D)-12.

The word line oxide 80, which is silicon dioxide 80 is then deposited everywhere to a thickness between approximately 30-65 angstroms. Polysilicon 82 is then deposited to a depth of approximately 1500 angstroms. The resultant structure is shown in FIGS. 4(A-D)-13.

The polysilicon 82 is then etched back by CMP (Chemical Mechanical Polishing), until the layer of oxide 76 is reached. A masking step is performed. Opening are created in the mask in all areas except along the row direction of A-A, B-B and C-C. The resultant structure is shown in FIGS. 4(A-D)-14.

Ion implant is performed forming the first regions 30. The resultant structure is shown in FIGS. 4(A-D)-15.

Inter Level Dielectric is then deposited and planarized. Bit line contacts are then made to the regions 30. The resultant structure is shown in FIGS. 4(A-D)-16.

From the foregoing, it can be sent that a scaled non-volatile memory cell and array is formed by the use of fin FETs.

What is claimed is:

1. A non-volatile memory cell comprising:
  a substrate layer;
  a fin shaped semiconductor member of a first conductivity type on said substrate layer having a first region of a second conductivity type and a second region of the second conductivity type, spaced apart from the first region with a channel region extending between the first region and the second region; said fin shaped member having a top surface and two side surfaces between the first region and the second region;
  a word line adjacent to the first region and capacitively coupled to a first portion of the channel region;
  a floating gate adjacent to the word line and capacitively coupled to a second portion of the channel region;
  a coupling gate capacitively coupled to the floating gate;

an erase gate insulated from the second region and adjacent to the floating gate and coupling gate; and wherein the floating gate has two sections with each section positioned adjacent to one of the side surfaces of the fin shaped member and is capacitively coupled thereto.

2. The non-volatile memory cell of claims 1 wherein said word line is capacitively coupled to the two side surfaces of the first portion of the fin shaped semiconductor member.

3. The non-volatile memory cell of claim 1 wherein said coupling gate is between the word line and the erase gate, and is insulated therefrom.

4. The non-volatile memory cell of claim 1 wherein the coupling gate is insulated from the top surface of the fin shaped member and is capacitively coupled to the two sections of the floating gate capacitively coupled to the two side surfaces of the fin shaped member.

5. A non-volatile memory device comprising:

a substrate layer;

a fin shaped semiconductor member of a first conductivity type on said layer having a first region of a second conductivity type and a second region of the second conductivity type spaced apart from the first region, with a third region of the second conductivity type located substantially midpoint between the first and second regions; said fin shaped member having a top surface and two side surfaces and extending longitudinally between the first region and the second region;

a pair of word lines, adjacent to the first region and the second regions respectively, and between the first region and the third region, and between the second region and the third region, respectively, and capacitively coupled to the fin shaped member;

a pair of floating gates, each adjacent to one of the word lines and between the one word line and the third region, and capacitively coupled to the fin shaped member;

a pair of coupling gates each capacitively coupled to a floating gate;

an erase gate insulated from the third region; and wherein each floating gate has two sections with each section positioned adjacent to one of the side surfaces of the fin shaped member and is capacitively coupled thereto.

6. The non-volatile memory device of claim 5 wherein each of said pair of coupling gates is positioned between a word line and the erase gate and insulated therefrom.

7. The non-volatile memory device of claim 5 wherein each word line is capacitively coupled to the two side surfaces of the fin shaped member.

8. The non-volatile memory device of claim 5 wherein each of said pair of coupling gates is capacitively coupled to each of the sections of the floating gate capacitively coupled to the side surface of the fin shaped member.

9. The non-volatile memory device of claim 5 wherein the erase gate is capacitively coupled to the top surface of the third region portion of the fin shaped semiconductor member.

10. An array of non-volatile memory cells comprising:

a substrate layer;

a plurality of fin shaped semiconductor members of a first conductivity type on said substrate layer, each of said fin shaped semiconductor member is spaced from one another and is substantially parallel to one another, with each having a first region of a second conductivity type and a second region of the second conductivity type, spaced apart from the first region with a channel region extending between the first region and the second region in a first direction; said fin shaped member having a top surface and two side surfaces between the first region and the second region;

a word line adjacent to the first region and capacitively coupled to a first portion of the channel region of each fin shaped member, and extending in a second direction substantially perpendicular to the first direction across a plurality of fin shaped members;

a floating gate adjacent to the word line capacitively coupled to a second portion of the channel region in each fin shaped member;

a coupling gate capacitively coupled to the floating gate; and extending in the second direction across a plurality of fin shaped members;

an erase gate insulated from the second region and adjacent to the floating gate and coupling gate, and extending in the second direction across a plurality of fin shaped members;

wherein the second region of each of the fin shaped member is connected to the second region of other fin shaped members in the second direction; and wherein said substrate layer is an insulator.

11. The array of claim 10 wherein the coupling gate is positioned adjacent to the word line and to the erase gate in each of the fin shaped members.

12. The array of claim 10 wherein each fin shaped member has a plurality of spaced apart first regions, with a bit line connecting to the plurality of first regions.

* * * * *